(12) United States Patent
Ditto et al.

(10) Patent No.: US 7,924,059 B2
(45) Date of Patent: Apr. 12, 2011

(54) RECONFIGURABLE AND RELIABLE LOGIC CIRCUIT ELEMENTS THAT EXPLOIT NONLINEARITY AND NOISE

(75) Inventors: William L. Ditto, Gainesville, FL (US);
Krishnamurthy Murali, Gainesville, FL (US); Sudeshna Sinha, Chennai (IN); Adi Bulsara, San Diego, CA (US)

(73) Assignees: University of Florida Research Foundation, Inc., Gainesville, FL (US); Control Dynamics, Inc., Bellevue, WA (US)

(*) Notice: Subject to any disclaimer, the term of this patent is extended or adjusted under 35 U.S.C. 154(b) by 101 days.

(21) Appl. No.: 12/394,749

(22) Filed: Feb. 27, 2009

(65) Prior Publication Data

US 2010/0219862 A1 Sep. 2, 2010

(51) Int. Cl.
*H03K 19/20* (2006.01)
(52) U.S. Cl. .......................................... 326/104; 326/38
(58) Field of Classification Search ............... 326/37–41, 326/46–47, 104
See application file for complete search history.

(56) References Cited

U.S. PATENT DOCUMENTS

| | | | |
|---|---|---|---|
| 3,473,160 A | 10/1969 | Wahlstrom | |
| 5,007,087 A * | 4/1991 | Bernstein et al. | ............... 380/46 |
| 5,260,610 A | 11/1993 | Pedersen et al. | |
| 5,291,555 A | 3/1994 | Cuomo et al. | |
| 5,504,841 A | 4/1996 | Tani | |
| 5,745,655 A | 4/1998 | Chung et al. | |
| 5,809,009 A | 9/1998 | Matsuoka et al. | |
| RE35,977 E | 12/1998 | Cliff et al. | |
| 6,014,445 A | 1/2000 | Kohda et al. | |
| 6,025,735 A | 2/2000 | Gardner et al. | |
| 6,850,252 B1 | 2/2005 | Hoffberg | |
| 6,876,232 B2 | 4/2005 | Yoo | |
| 7,068,069 B2 | 6/2006 | Fujita | |
| 7,453,285 B2 * | 11/2008 | Kiel et al. | ........................ 326/38 |
| 2002/0051546 A1 | 5/2002 | Bizjak | |
| 2003/0216919 A1 | 11/2003 | Roushar | |
| 2004/0036636 A1 | 2/2004 | Mai et al. | |
| 2004/0103381 A1 | 5/2004 | Shinomiya | |
| 2005/0073337 A1 * | 4/2005 | Ditto et al. | ........................ 326/38 |
| 2006/0091905 A1 * | 5/2006 | Ditto et al. | ........................ 326/41 |
| 2008/0130084 A1 | 6/2008 | Goddard et al. | |

(Continued)

OTHER PUBLICATIONS

Murali, et al., "Realization of the fundamental NOR gate using a chaotic circuit," Physical Review 68:1-5, 2003.

(Continued)

*Primary Examiner* — Jason M Crawford
(74) *Attorney, Agent, or Firm* — Jon A. Gibbons; Fleit Gibbons Gutman Bongini & Bianco PL

(57) ABSTRACT

A logic gate is adapted to implement logical expressions. The logic gate includes at least one input that is adapted to receive an input signal and at least one control signal. At least one of the input signal and the control signal is a noise signal. At least one output is adapted to produce an output signal. A nonlinear updater operates as a dynamically configurable element and produces multiple different logic gates as selected by the control signal based at least in part on the noise signal. The nonlinear updater is electrically coupled to the input and is also electrically coupled to the output. The nonlinear updates is configured to apply a nonlinear function to the input signal in response to the control signal to produce the output signal representing a logical expression being implemented by one of the multiple different logic gates on the input signal.

20 Claims, 11 Drawing Sheets

U.S. PATENT DOCUMENTS

2008/0150578 A1* 6/2008 Kiel et al. .................. 326/38
2008/0278196 A1* 11/2008 Ditto et al. .................. 326/38

OTHER PUBLICATIONS

Murali, et al., "Implementation of NOR Gate by a Chaotic CHUA's Circuit,"Unpublished.

Munakata et al., "Chaos Computing: Implementaion of Fundamental Logical Gates by Chaotic Elements," IEEE Transactions on Circuits and Systems-I: Fundamental Theory and Applications, 49:1629-1633, 2002.

Murali, et al., "Experimental Chaos Computing," Submitted to IEE 'Trans. On Circuits and Systems, Manuscript Received May 30, 2003.

Murali, et al., "Logic from Nonlinear Dynamical Evolution," To be published in Mar. 6, 2009 issue of Physical Review Letters.

Murali, et al., Reliable Logic Circuit Elements that Exploit Nonlinearity in the Presence of a Noise-Flloor,: Currently Unpublished.

Sinha, et al., "Computing with Distributed Chaos," The American Physical Society, Copyright 1999; 1063-651X/99/60(1)/363(15).

Sinha, et al., "Flexible parallel implementation of logic gates using chaotic elements," Physics Review E, vol. 65, Issue 3, Phys.Rev. E65, 036216, 2002.

International Search Report dated Jul. 13, 2005 for PCT/US04/33108.

International Search Report and Written Opinion dated Sep. 27, 2010 for International (PCT) Application No. PCT/US2010/025587.

* cited by examiner

RECONFIGURABLE AND RELIABLE LOGIC CIRCUIT ELEMENTS THAT EXPLOIT NONLINEARITY AND NOISE

STATEMENT REGARDING FEDERALLY SPONSORED RESEARCH OR DEVELOPMENT

The present invention was made with government support, in part, by the Office of Naval Research under grant N00014-02-1-1019. The Government has certain rights in this invention.

CROSS-REFERENCE TO RELATED APPLICATIONS

This application is based upon and claims priority from prior U.S. patent application Ser. No. 12/174,332 filed Jul. 16, 2008, now U.S. Pat. No. [pending] which is a continuation of and claims priority from U.S. patent application Ser. No. 11/304,125 filed Dec. 15, 2005, now U.S. Pat. No. 7,415,683, which is a continuation of and claims priority from U.S. patent application Ser. No. 10/680,271 filed on Oct. 7, 2003, now U.S. Pat. No. 7,096,437, the entire disclosure of each application is incorporated by reference in their entirety.

FIELD OF THE INVENTION

The present invention generally relates to the field of dynamic computing, and more particularly relates to chaotic computing architecture for logic gates.

BACKGROUND OF THE INVENTION

Over the last few years, it has become increasingly important that understanding how noise and nonlinearity cooperate, in a dynamical system, to produce novel effects is critical in understanding how complex systems behave and evolve. Stochastic resonance (SR) provides one such example wherein the cooperative behavior between noise and dynamics produces interesting, often counter intuitive, physical phenomena. SR has received much attention over the past few decades (See, for example, Gammaitoni, P. Hanggi, P. Jung and F. Marchesoni, Rev. Mod. Phys. 70, 223 (1998); Bulsara, A. R. & Gammaitoni, L., Physics Today 49, 39 (1996) and P. Hanggi, et al., Phys. Rev. E 62, 6155 (2000); J. Casado-Pascual et al., Phys. Rev. Letts. 91, 210601 (2003), which are hereby incorporated by reference in their entireties) and consists of the enhancement of weak input signals through a delicate interplay between the signal, noise, and nonlinearity (threshold). As computational devices and platforms continue to shrink in size and increase in speed, fundamental noise characteristics are being increasingly encountering that cannot be suppressed or eliminated.

SUMMARY OF THE INVENTION

In one embodiment, a logic gate adapted to implement logical expressions is disclosed. The logic gate comprises at least one input that is adapted to receive an input signal and at least one control signal. At least one of the input signal and the control signal is a noise signal. At least one output is adapted to produce an output signal. A nonlinear updater operates as a dynamically configurable element and produces a plurality of different logic gates as selected by the control signal based at least in part on the noise signal. The nonlinear updater is electrically coupled to the input and is also electrically coupled to the output. The nonlinear updates is configured to apply a nonlinear function to the input signal in response to the control signal to produce the output signal representing a logical expression being implemented by one of the plurality of different logic gates on the input signal.

In another embodiment, a system adapted to implement a logical expression is disclosed. The system comprises an array with at least two or more configurable logic gates. Each of the two or more configurable logic gates comprises at least one input adapted to receive an input signal and at least one control signal. At least one of the input signal and the control signal is a noise signal. Each of the two or more configurable logic gates also comprises at least one output adapted to produce an output signal. Each of the two or more configurable logic gates further comprises a nonlinear updater that operates as a dynamically configurable element to produce a plurality of different logic gates as selected by the control signal based at least in part on the noise signal. The nonlinear updater is electrically coupled to the input and electrically coupled to the output and configured to apply a nonlinear function to the input signal in response to the control signal to produce the output signal representing a logical expression being implemented by one of the plurality of different logic gates on the input signal.

In yet another embodiment, a method of changing functionality of a logic gate is disclosed. The method comprises receiving at least one input adapted to receive an input signal and at least one control signal. At least one of the input signal and the control signal is a noise signal. A nonlinear updater is operated as a dynamically configurable element to produce a plurality of different logic gates as selected by the control signal based at least in part on the noise signal. The nonlinear updater is electrically coupled to the input and electrically coupled to an output. A nonlinear function is applied to the input signal by the nonlinear updater in response to operating the nonlinear updater. An output signal representing a logical expression being implemented by one of the plurality of different logic gates on the input signal is produced in response to applying the nonlinear function.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

Figure 1:
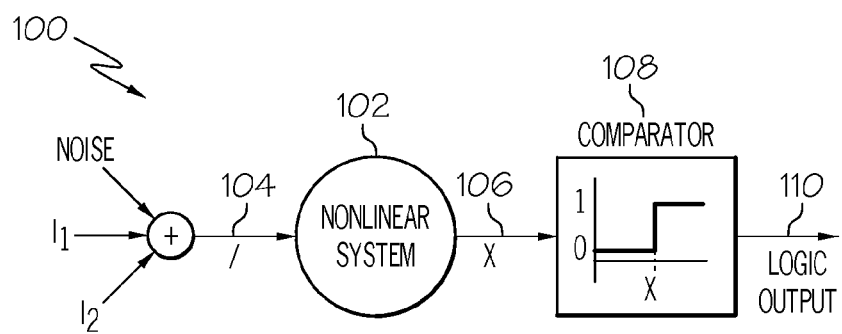
FIG. 1 is a schematic diagram of a logic cell comprised of a nonlinear system forced by an input signal ($I=I_1+I_2+Noise$) according to one embodiment of the present invention.

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure and function. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The following embodiments show how the interplay between a noise-floor and the (in this case static) nonlinearity can be exploited for the design of key logic-gate structures (from the engineering point of view, it has been ascertained that SR based NOR logic gates can be concatenated efficiently to give the important combinational Set-Reset Flip-Flop operations (see, for example, K. Murali, S. Sinha and W. L. Ditto, to appear in *Int. J. Bifurc. and Chaos (Letts.)* (2009)), which is hereby incorporated by reference in its entirety). In particular, the direct and flexible implementation of the fundamental logic gates NOR and NAND in an optimal band of noise, from which any universal computing device can be constructed is discussed. Further, the switching of logic functions by using the (adjustable directly, or via a bias signal C) nonlinearity as a "logic response controller" is discussed as well. In effect, one is able to obtain the most basic ingredients of general purpose hardware that has potential for reconfigurability. It should be noted that a very simple form of nonlinearity (underpinned by dynamics EQ. (2) and thresholds) has been chosen for this discussion because of its ease of realization in an experimental circuit; more general potential systems have been considered. The various embodiment of the present invention also allow for LSR to be exploited in nontraditional computing systems, even in the quantum realm (See, for example, R. L. Badzey and P. Mohanty, *Nature* 437, 995 (2005), which is hereby incorporated by reference in its entirety).

Logical Stochastic Resonance System

The response of a noisy nonlinear system to deterministic input signals can be enhanced by cooperative phenomena e.g. stochastic resonance (SR). The following discussion shows that when two square waves are presented as input to a two-state system, the response of the system, in one embodiment, can produce a logical output (e.g., NOR/OR) with a probability controlled by the interplay between the noise intensity and the nonlinearity. As the noise is increased (for fixed threshold/nonlinearity), the probability of the output reflecting a NOR/OR operation increases to unity and then decreases. Changing the nonlinearity (or the thresholds) of the system changes the output into another logic operation (e.g., NAND/AND) whose probability displays analogous behavior. Thus, the interplay of nonlinearity and noise can yield flexible logic behavior, and the natural emergent outcome of such systems is, effectively, a logic gate. This "Logical Stochastic Resonance" (LSR) is discussed below, with respect to a non-limiting simple experimental realization of a two-state system underpinned by two (adjustable) thresholds. Also, the response of a simple threshold detector to input signals, consisting of two random square waves is investigated and shown that in an optimal band of noise, the output is a logical combination of the two input signals: Logical Stochastic Resonance (LSR).

Figure 13:
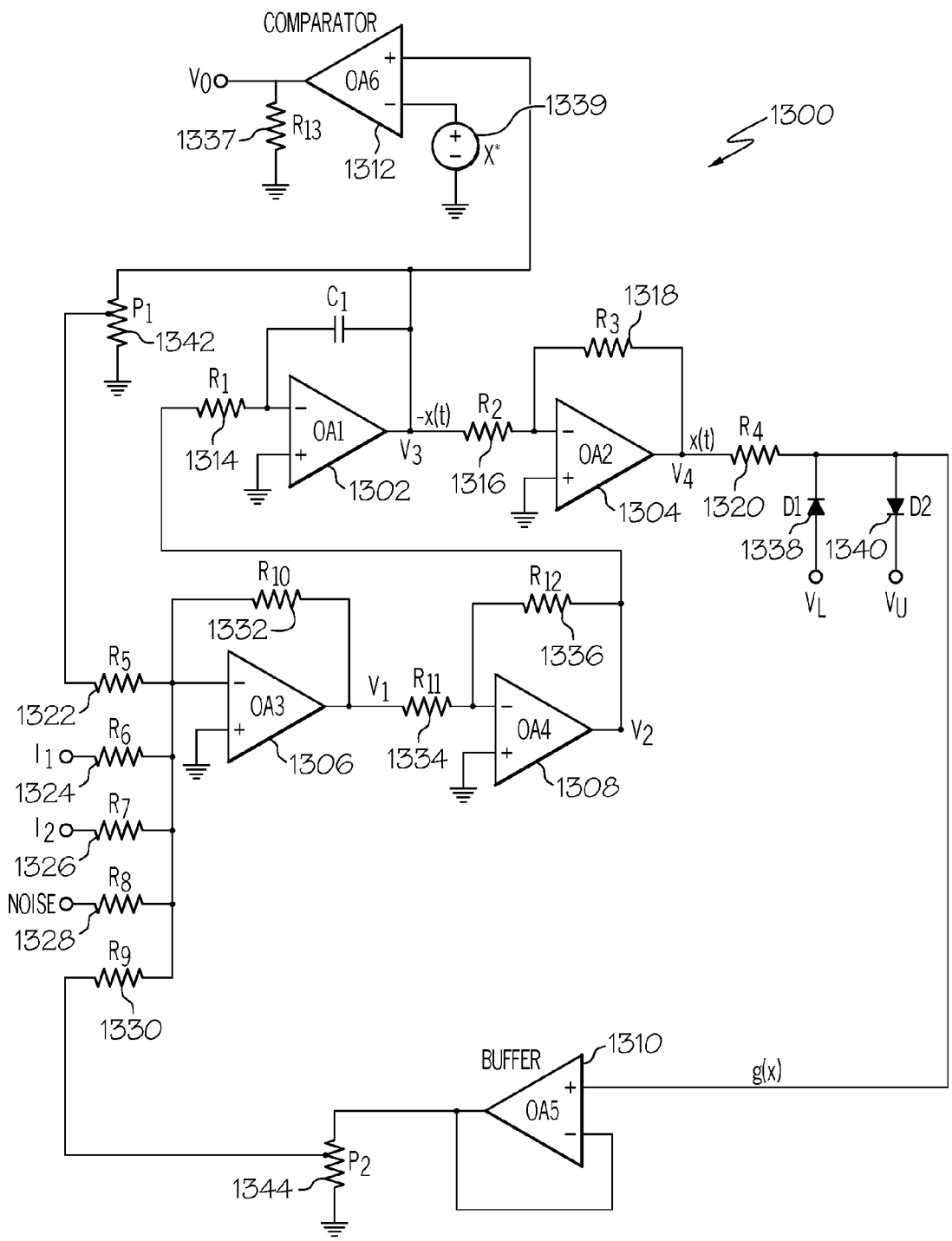
FIG. 13 is an analog simulation circuit diagram of a nonlinear system according to one embodiment of the present invention.

In one embodiment, consider a logic cell 100 as shown in FIG. 1. The logic cell 100 comprises a nonlinear dynamic system 102 that is forced by an input signal $(I=: I_1+I_2+\text{Noise})$ 104. The nonlinear system 102 generates an output 106 that is received by a comparator 108, which generates a logic output 110. In one embodiment, the nonlinear system 102 includes a nonlinear updater (not shown) that operates as a dynamically configurable element to produce a plurality of different logic gates as selected by a control signal based at least in part on a noise signal. The nonlinear updater is electrically coupled to the input and the output of the system 100. The nonlinear updater is configured to apply a nonlinear function to the input signal in response to the control signal to produce an output signal representing a logical expression being implemented by one of the plurality of different logic gates on the input signal. One example of a circuit for implementing the logic cell 100 of FIG. 1 is shown in FIG. 13. The nonlinear dynamic system 102, in one embodiment, is given by:

$$\dot{x}=F(x)+I+D\eta(t), \quad (1)$$

where F(x) is a generic nonlinear function giving rise to a potential with two distinct energy wells. I is a low amplitude input signal and $\eta(t)$ is an additive zero-mean Gaussian noise with unit variance. D is the noise strength, wherein the noise is taken to have correlation time smaller than any other time scale in the system, so that it may be represented, theoretically, as delta correlated.

Usually, a logical input-to-output correspondence is achieved by encoding N inputs in N square waves. Specifically, for two logic inputs, we drive the system with a low amplitude signal I, taken to be the sum and/or two trains of aperiodic pulses: $I_1+I_2$, with $I_1$ and $I_2$ encoding the two logic inputs. The logic inputs can be either 0 or 1, giving rise to 4 distinct logic input sets $(I_1, I_2)$: (0,0), (0,1), (1,0) and (1,1). Now the input sets (0,1) and (1,0) give rise to the same I, and so the 4 distinct input conditions $(I_1, I_2)$ reduce to 3 distinct values of I. Hence, the input signal I, generated by adding two independent input signals, is a 3-level aperiodic waveform.

The output 110 of the system is determined by its state e.g., the output can be considered a logical 1 if it is in one well, and logical 0 if its in the other. Specifically the output corresponding to this 2-input set ($I_1$, $I_2$), for a system with potential wells at $x_+>0$ and $x_-<0$, is taken to be 1 (or 0) when the system is in the well at $x_+$, and 0 (or 1) when the system is in the other well (at $x_-$). Hence, when the system switches wells, the output is "toggled".

Thus, as will be shown, one observes, for a given set of inputs ($I_1$, $I_2$), a logical output 110 from this nonlinear system 102, in accordance with the truth tables of the basic logic operations shown in Table I. One observation is that this occurs consistently and robustly substantially only within an optimal window of noise. For very small or very large noise the system does not yield any consistent logic output, in line with the basic tenets of SR. But in a reasonably wide band of moderate noise, the system produces the desired logical outputs consistently. Table I shows the relationship between the two inputs and the output of the fundamental OR, AND, NOR and NAND logic operations. Note that the four distinct possible input sets (0,0), (0,1), (1,0) and (1,1) reduce to three conditions as (0,1) and (1,0) are symmetric. Any logical circuit can be constructed by combining the NOR (or the NAND) gates (See, for example, M. M. Mano, "Computer System Architecture", Prentice-Hall (1993); T. C. Bartee, "Computer Architecture and Logic Design", Mc-Graw Hill (1991)", which is hereby incorporated by reference in its entirety).

TABLE I

| Input Set ($I_1$, $I_2$) | OR | AND | NOR | NAND |
|---|---|---|---|---|
| (0, 0) | 0 | 0 | 1 | 1 |
| (0, 1)/(1, 0) | 1 | 0 | 0 | 1 |
| (1, 1) | 1 | 1 | 0 | 0 |

Figure 2:
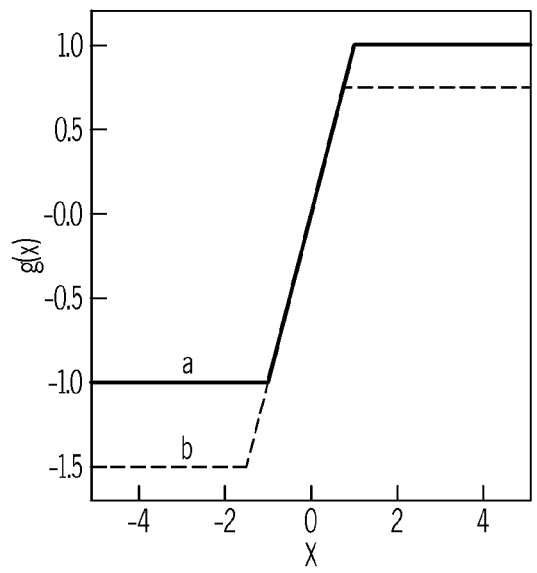
FIGS. 2-3 are plots showing a piecewise linear function $g(x)$ and the effective potential it gives rise to according to one embodiment of the present invention.
Figure 3:
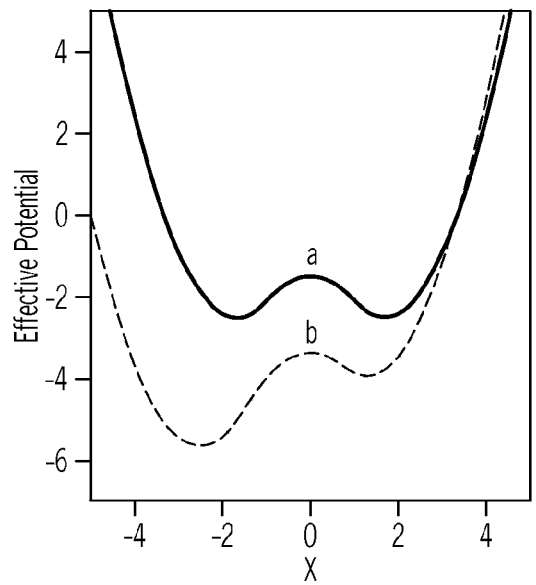

LSR is now discussed with respect to a non-limiting and simple nonlinear system, which can be implemented with an efficient electronic analog such as:

$$\dot{x} = -\alpha x + \beta g(x) + D\eta(t) + I_1 + I_2, \quad (2)$$

with the nonlinear function g(x) given by $$g(x) = x \text{ when } x^*_l \leq x \leq x^*_u$$

$$g(x) = x^*_l \text{ when } x < x^*_l$$

$$g(x) = x^*_u \text{ when } x > x^*_u \quad (3)$$

where $x^*_u$ and $x^*_l$ are upper and lower thresholds respectively, as shown in FIGS. 2 and 3. For example, FIG. 2 shows the piecewise linear function g(x) and FIG. 3 shows the effective potential that g(x) gives rise to. FIGS. 2 and 3 illustrate thresholds (a) $x^*_l=-1$, $x^*_u=1$ (solid line) and (b) $x^*_l=-1.5$, $x^*_u=0.75$ (dashed line). Equal upper and lower thresholds (i.e., $x^*_l=x^*_u$) give rise to symmetric wells and I=0, $\alpha=1.8$, and $\beta=3.0$. The effective potential generated by the thresholding is bistable with stable energy states (potential minima) at $x_-=(\beta x^*_l/\alpha)$ and (potential maxima) at $x_+=\beta x^*_u/\alpha$, in the absence of the signal I. Here, instead of manipulating the nonlinearity by varying $\alpha$ and $\beta$ one embodiment varies the nonlinearity by simply changing the threshold $x^*_u$ and $x^*_l$ in EQ. (2). This allows the heights and asymmetry of the wells to be manipulated very efficiently (see FIGS. 2 and 3).

Numerical Simulation Results

Figure 4:
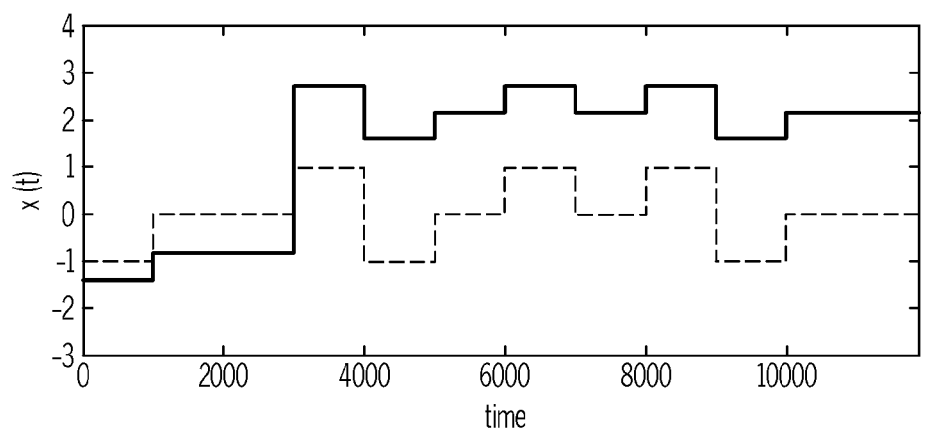
FIGS. 4-6 are plots that show the response of a nonlinear system with $\alpha=1.8$, $\beta=3.0$, and thresholds set to $(x^*_l, x^*_u)=(-0.5, 1.3)$ according to one embodiment of the present invention.
Figure 5:
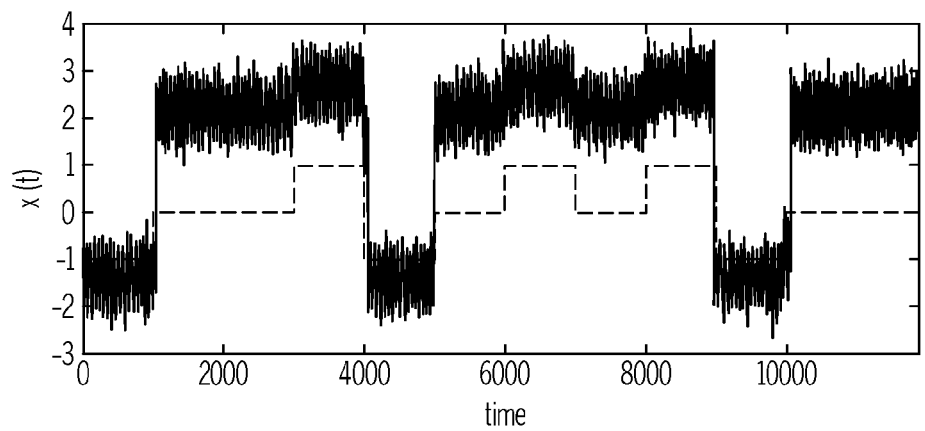
Figure 6:
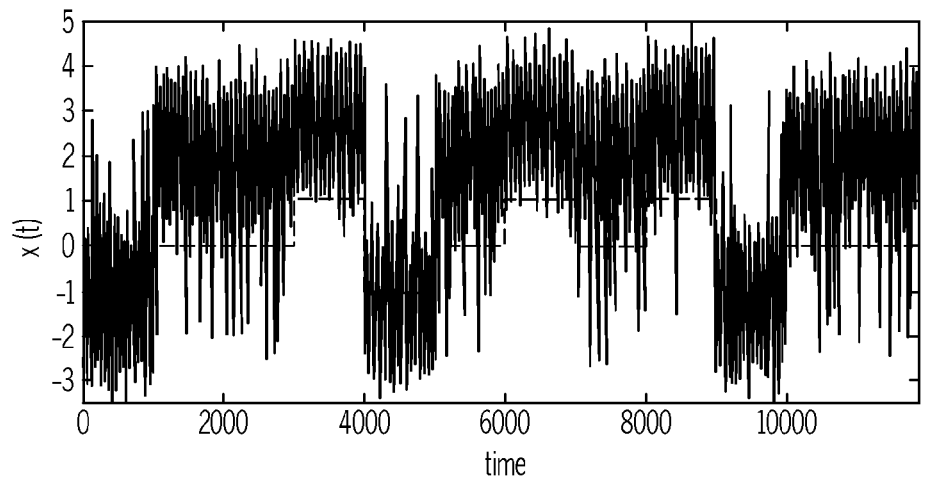

With no loss of generality, consider the two (randomly switched) inputs $I_1$ and $I_2$ to take value −0.5 when the logic input is 0, and value 0.5 when logic input is 1. Then, the input signal I=$I_1$+$I_2$ is a three-level aperiodic square wave form. FIGS. 4-6 illustrates the response of the system defined by EQ (2) for thresholds ($x^*_u$, $x^*_l$)=(1.3, −0.5), $\alpha=1.8$, and $\beta=3.0$, and 3 choices of noise intensity D. For example, each of the FIGS. 4-6 has two curves. Solid curves represent the solution x(t) from numerical simulations for additive noise intensities D equal to (top to bottom) 0.01, 0.5 and 1. The input I is the sum of randomly switched square pulse trains and is the same (dashed line) in each of the FIGS. 4-6. For an optimal noise intensity (e.g. FIG. 5) a reliable OR/NOR gate is obtained.

In one embodiment, it is observed that, under optimal noise (FIG. 5), interpreting the state x<0 as logic output 0 and the state x>0 as logic output 1 yields a clean (i.e., stable) logical OR whereas interpreting the state x>0 as logic output 0 and the state x<0 as logic output 1 yields a clean logical NOR. In a completely analogous way, by setting the thresholds at ($x^*_u$, $x^*_l$)=(0.5, −1.3), clean AND and NAND gates are realized in almost the same optimal noise intensity regime as the previous case. Note that NAND and NOR are fundamental logic gates which can, in combination, yield all possible logical responses.

The (numerical) observations above, can be explained in the standard framework of SR in overdamped systems underpinned by double well potentials (See, for example, L. Gammaitoni, P. Hanggi, P. Jung and F. Marchesoni, Rev. Mod. Phys. 70, 223 (1998); Bulsara, A. R. & Gammaitoni, L., Physics Today 49, 39 (1996); and P. Hanggi, et al., Phys. Rev. E 62, 6155 (2000); J. Casado-Pascual et al., Phys. Rev. Letts. 91, 210601 (2003), which are hereby incorporated by reference in their entireties).

The different outputs, obtained by driving the state of the system to one or the other well, are realized by appropriately manipulating the heights and asymmetry of the wells. One can, then, readily understand the occurrence of a particular logic output: when inputs $I_1$ and $I_2$ are added, the effective position and depth of the wells change, to $x_-=\{\beta x^*_l+I_1+I_2\}/\alpha$ and $x_+=\{\beta x^*_u+I_1+I_2\}/\alpha$. This asymmetry causes the state of the system to switch to the desired well under adequate noise. For $x^*_u>|x^*_l|$ the NOR logic operation is obtained, and for $x^*_u<|x^*_l|$ the NAND logic operation is obtained.

Figure 7:
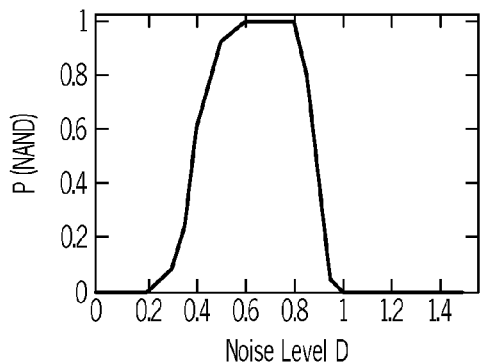
FIGS. 7-8 are plots of the probability of obtaining the NAND logic operation and the probability of obtaining the NOR logic operation according to one embodiment of the present invention.
Figure 8:
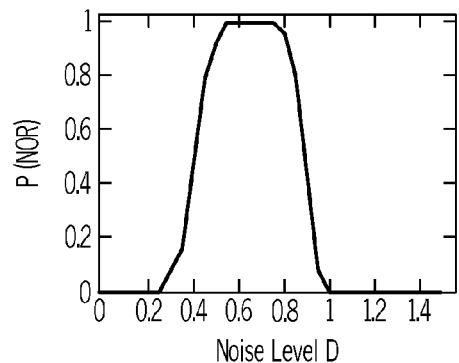

The consistency (or reliability) of obtaining a given logic output can be quantified by calculating the probability of obtaining the desired logic output for different input sets. This probability, P(logic), is the ratio of the number of correct logic outputs to the total number of runs. Each run samples over the four input sets (0,0), (0,1), (1,0), (1,1), in different permutations. If the logic output, as obtained from x(t), matches the logic output in the truth table for all four input sets in the run, it is considered a success. When P(logic) is close to 1 the logic operations is obtained very reliably. FIGS. 7 and 8 show this quantity obtained from extensive numerical simulations. For example, FIG. 7 shows the probability of obtaining the NAND logic operation, P(NAND), with ($x^*_l$, $x^*_u$)=(−1.3, 0.5). A similar result is obtained, as shown in FIG. 8, for P(NOR) taking) ($x^*_l$, $x^*_u$)=(−0.5, 1.3).

It is evident that the fundamental logic operation NAND (and, analogously NOR) is realized, consistently, in an optimal band of moderate noise. The inventors have discovered in this embodiment that these stable logic operations are only realized (for subthreshold input signals) in the presence of noise. More specifically, in relatively wide windows of moderate noise, the system yields logic operations with near certain probability i.e. P(logic)~1. One should note the occurrence of a flat maximum rather than the usual peak associated with SR (this usual peak associated with SR is further discussed in L. Gammaitoni, P. Hanggi, P. Jung and F. Marchesoni, Rev. Mod. Phys. 70, 223 (1998) and Bulsara, A. R. & Gammaitoni, L., *Physics Today* 49, 39 (1996)). This is due to the choice (a probability) of performance measure in this embodiment. The logic response is almost 100% accurate in a wide window of the noise; in this sense, the gate is quite robust to background fluctuations.

The inventors have discovered in this embodiment that (perhaps, somewhat counter intuitively) noise plays a constructive role in obtaining a large, robust, asymmetric response to input signals, i.e. different (and distinct) levels of input pulses yield 0/1 output, determined by the system being in either one of the two widely separated wells. It should be noted that in marked contrast to the enhanced response of a stochastic nonlinear system to low amplitude input pulses, noisy or noise-free linear systems cannot amplify the output; nor can linear systems yield the strongly asymmetric response to equi-spaced input levels necessary to map different input sets to a binary logic output. Further, noise has the effect of simply degrading performance in linear systems, completely unlike the non-trivial effect of noise here.

This kind of response is necessary for logic operations, as it allows one to consistently map different distinct inputs to a binary output. For instance, for NAND logic, two input signals, (0,0) and (0,1)/(1,0), result in the system being in the wells at $x_+$ and one input set (1,1) results in the system being in well $x_-$. Whereas for NOR logic, two input signals, (0,1)/(1,0) and (1,1), result in the system being in the well at $x_-$ and one input set (0,0) results in the system being in well $x_+$. Such mappings can be obtained, in principle, for any multiple-input logic operation by an appropriate choice of parameters.

Figure 9:
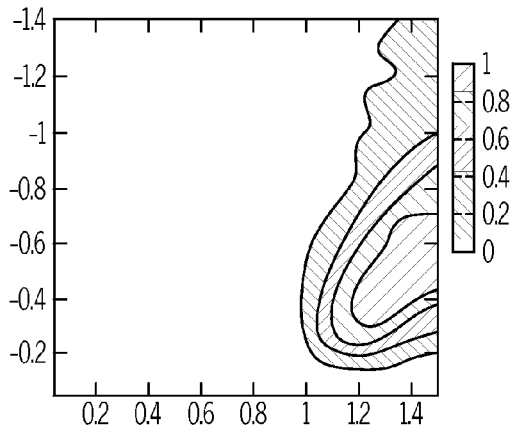
FIGS. 9-10 are density maps of P(logic) for the NOR and NAND logic operations for fixed noise (D=0.7V), in the space of upper threshold $x^*_u$ (x-axis) and lower threshold $x^*_l$ (y-axis) according to one embodiment of the present invention.
Figure 10:
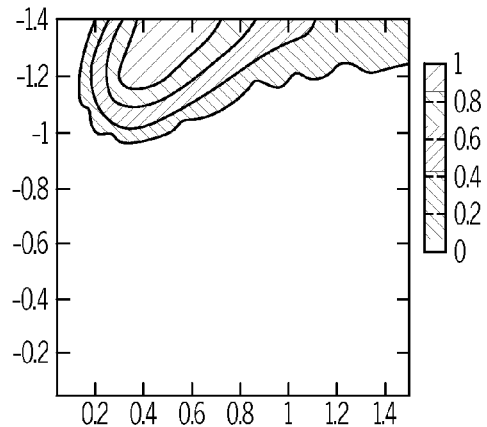

Further, for a fixed noise level, it is evident, as shown in FIGS. 9 and 10, that different types of logic (NAND vis-à-vis NOR) are obtained in different ranges of thresholds. This is because the thresholds at $(x^*_u, x^*_l)$ determine the position, depths and asymmetry of the potential wells (FIGS. 2 and 3), which in turn dictate the switching dynamics in response to the input stream. Significantly, this implies that one can "morph" between logic responses by simply adjusting a threshold in a suitable window of noise. This has been demonstrated, explicitly, in the electronic analog realization of EQ. (2). This is, of course, a desirable characteristic of the dynamics; one typically does not inject noise into the system if the desired behavior can be obtained by varying deterministic parameters (in this case, the thresholds).

The effect of an additional constant input bias C (over a temporal interval much longer than the noise correlation time) has also been studied. As the value of the bias changes (keeping the nonlinearity and noise level fixed), it is observed that the response of the system switches from NOR to NAND logic, or vice versa. The important point is that changing C changes the symmetry of the potential wells, and leads to different logical responses. It should be underscored that while the logic responses are switched by changing the nonlinearity or the bias, the desired output is obtained only for optimal noise intensities (FIGS. 7 and 8), without which one would not be able to extract any significant consistent logic response.

Figure 11:
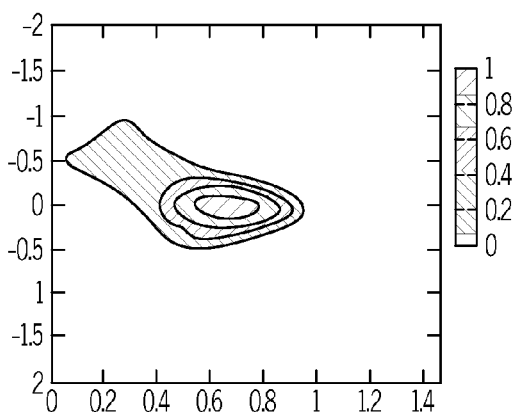
FIGS. 11-12 are as are density maps of P(logic) for the NOR and NAND logic operations as functions of the noise intensity D (x-axis) and asymmetrizing dc input C (y-axis) according to one embodiment of the present invention.
Figure 12:
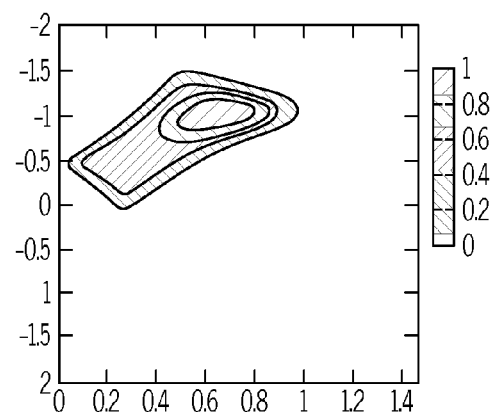

FIGS. 11 and 12 show the behavior discussed in the preceding paragraphs. For example, in each of FIG. 11 and FIG. 12 the probability P(logic) is plotted versus the external bias C and the noise intensity D. For a given noise intensity (in the optimal range of FIGS. 7 and 8) this figure shows that adjusting the parameter C will yield the desired logic behavior. The important point here is that the "plateaus" (FIGS. 7 and 8) overlap for the NOR and NAND performance for the different thresholds (FIGS. 9 and 10). Hence, for a noise intensity somewhere in the "plateau", one can switch from NOR and NAND (and vice versa) operations by simply adjusting the nonlinearity (i.e. thresholds), or applying a (controlled) dc input signal C.

While in this explicit example a 2-input logic has been demonstrated, multiple input logic behavior has also been observed, such as 3-input logic, with the input signal being $I=I_1+I_2+I_3$, i.e., the input is an aperiodic train of 4-level square pulses. It should be noted that multiple input logic gates are preferred mainly for reasons of space in circuits and, further, many combinational and sequential logic operations can be realized with these logic gates, in which one can minimize the propagation delay. Such multiple input gates are more power efficient, and have better performance in a wide range of applications. The generality of the idea has also been checked over a range of systems, including simple bistable systems such as Schmitt Trigger and systems with soft nonlinearities. Further, it was found that multiplicative noise also yields LSR.

Experimental System and Results

The schematic experimental circuit diagram 1300 of simulating the dynamics of EQ. (2) is shown in FIG. 13 where the logic output $V_0$ is measured across the comparator. In particular, FIG. 13 is a more detailed view of the logic cell 100 of FIG. 1. This circuit includes six operational amplifiers 1302, 1304, 1306, 1308, 1310, 1312 such as (but not limited to) Op-amps AD712 or µA 741 or AD844. The circuit 1300 also includes, twelve resistors ($R_1$-$R_{12}$) 1314-1336, load resistor (R13) 1337, and two diodes ($D_1, D_2$) 1338, 1340 realized, in this example, with 1N4148 and two variable resistors ($P_1, P_2$) 1342, 1344. The circuit with op-amp $OA_1$ 1302 acts as an integrating amplifier. Circuits with op-amps $OA_2$ 1304 and $OA_4$ 1308 act as sign-changers or inverting amplifiers. Circuits with op-amp $OA_3$ 1306 act as an inverting summing amplifier. Circuit with op-amp $OA_5$ 1310 acts as a voltage buffer or unity-gain amplifier. Circuit with op-amp $OA_6$ 1312 act as a voltage comparator. The node voltages $V_1, V_2, V_3$ and $V_4$ are represented as:

$$V_1 = -(\alpha V_3 + I_1 + I_2 + D\eta(t) + g(V_4)), \quad (4a)$$

$$V_2 = (\alpha V_3 + I_1 + I_2 + D\eta(t) + g(V_4)), \quad (4b)$$

$$V_3 = (-1/R_1 C_1) \int V_2 dt, \quad (4c)$$

$$V_4 = -V_3. \quad (4d)$$

Now choosing for the various resistors and capacitor values R1=R5=R9=10K, R4=14K, R2=R3=R6=R7=R8=R10=R11=R12=R13=100K, C1=10 nF, redefining V3 as −x(t), V4 as x(t) and rescaling t=R1C1τ, the EQ. (2) follows, provided the parameters are redefined as τ=t, p2=β, and p1=α. Choosing α=1.8 and β=3.0, the circuit shown in FIG. 7 will immediately give the waveform x(t), −x(t) and logic output waveform V0 from the comparator with threshold reference value x*=0V.

In actual experiments, D is the noise intensity denoted in terms of voltage and the noise is generated by using a noise function generator (e.g., Agilent HP33120A). With no loss of generality, consider the two (randomly switched) inputs $I_1$ and $I_2$ to take value −0.5V when the logic input is 0, and value 0.5V when logic input is 1. Then, the input signal I=I1+I2 is a three-level aperiodic square wave form. In actual circuit experiments by considering the diode cut-off voltage (in the present case, 0.7V), the threshold control voltages $V_U$ and $V_L$, are suitably fixed so that the effective threshold levels will be set at desired values of $x^*_u$ and $x^*_l$.

Figure 14:
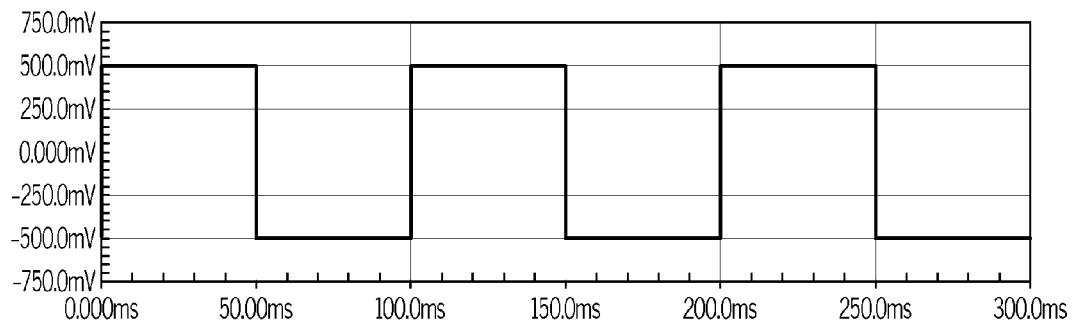
FIGS. 14-19 are graphs that show the dynamics of a nonlinear system under different noise levels D for $(x^*_u, x^*_l)=$ (1.3V, −0.5V) according to one embodiment of the present invention.
Figure 15:
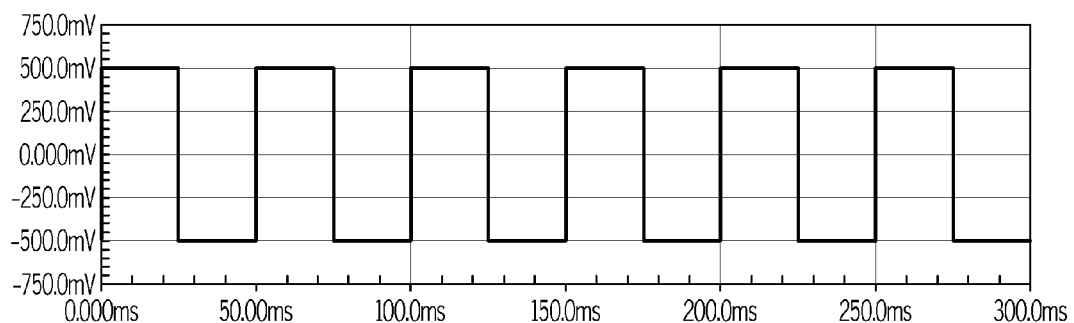
Figure 16:
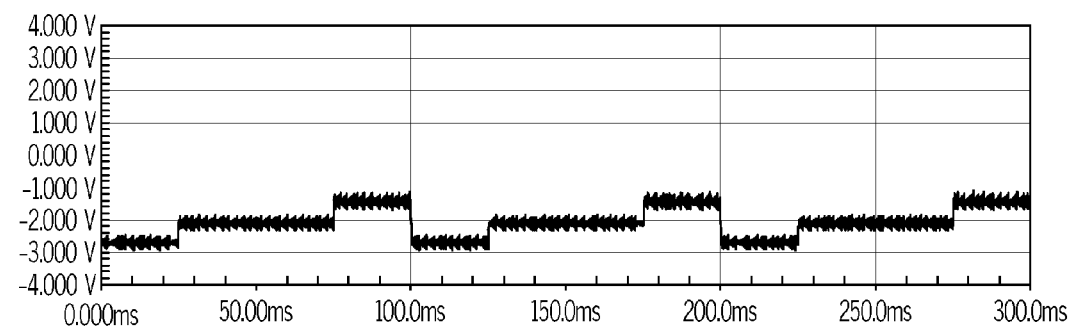
Figure 17:
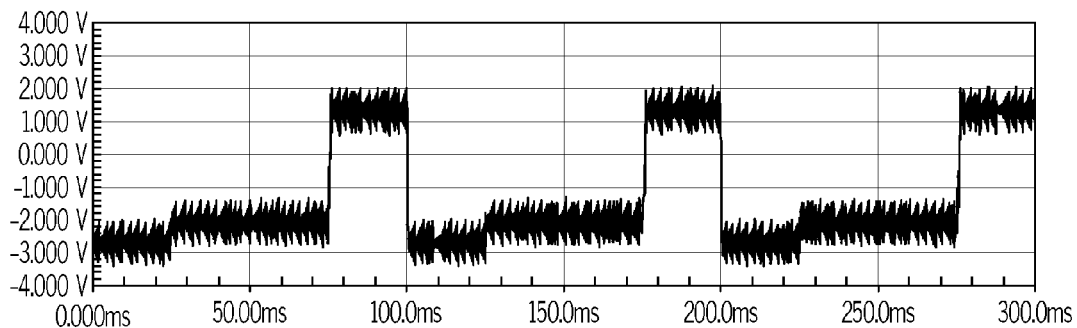
Figure 18:
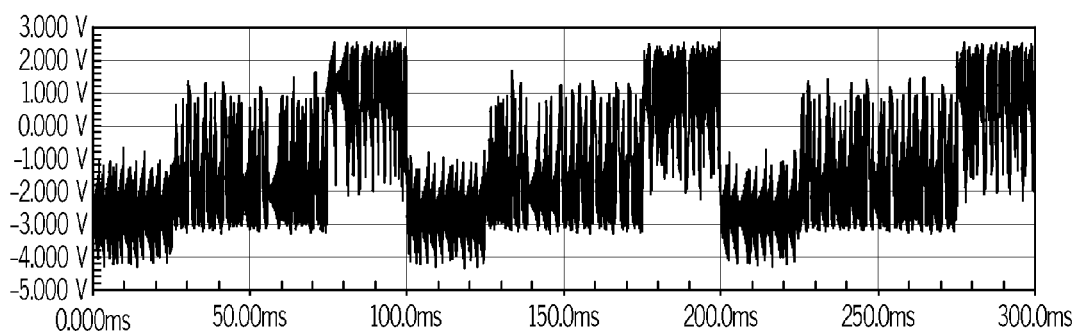
Figure 19:
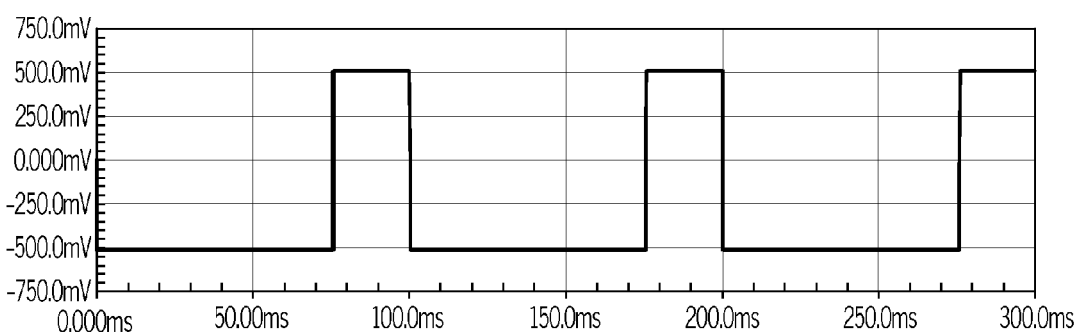

FIGS. 14-19 show the dynamics of the system under different noise levels D for $(x^*_u, x^*_l)=(1.3V, -0.5V)$. FIGS. 14 and 15 show streams of inputs $I_1$ and $I_2$, which take value −0.5V when logic input is 0 and value 0.5V when logic input is 1. FIGS. 16, 17, 18 show the waveforms of $V_3=-x(t)$ obtained from the circuit of FIG. 13 (with $(x^*_u, x^*_l)=(1.3V,-0.5V)$) under noise levels D: (i) 0.5V, (ii) 1.5V, (iii) 3V. When the noise levels is in an optimal band, D=1.5V, the desired NOR logic output, while for small or larger noise, one does not obtain the necessary response. The FIG. 19 shows the recovered NOR logic response from the signal $V_3=-x(t)$ through the comparator output $V_0$.

Figure 20:
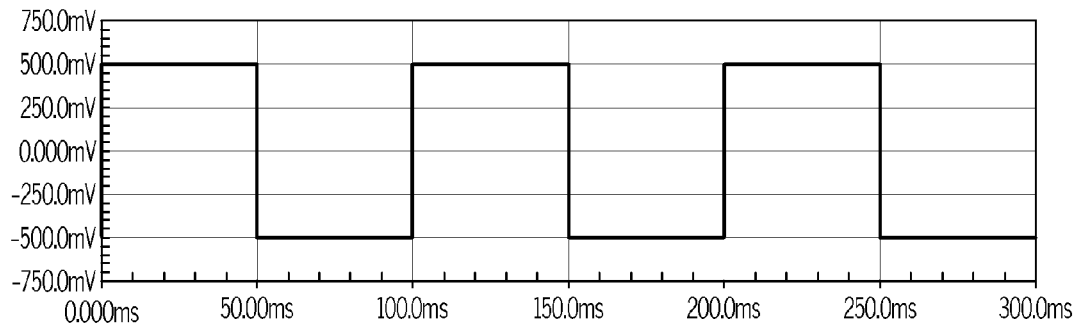
FIG. 20-25 are graphs showing how clean NAND gates can be realized in substantially the same optimal noise intensity regime as that of FIGS. 14-19 according to one embodiment of the present invention.
Figure 21:
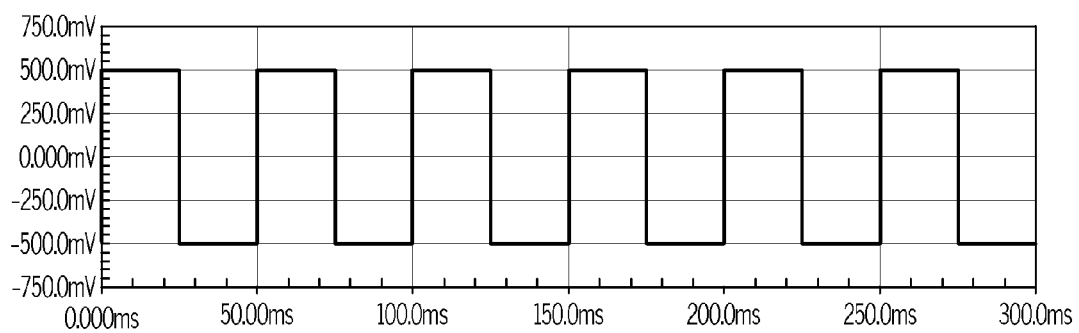
Figure 22:
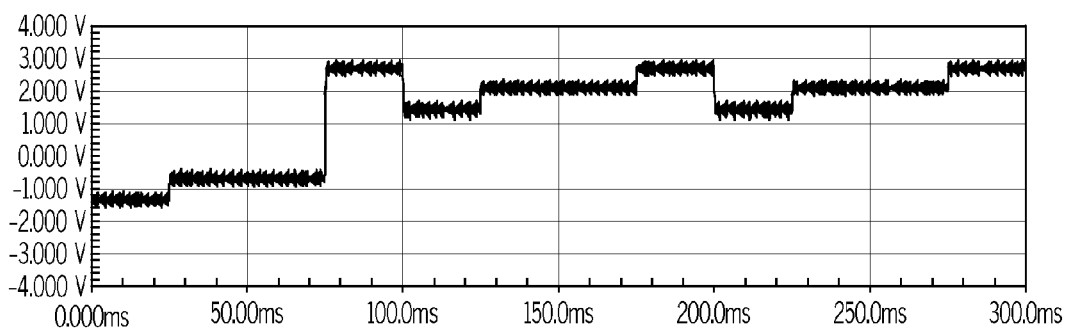
Figure 23:
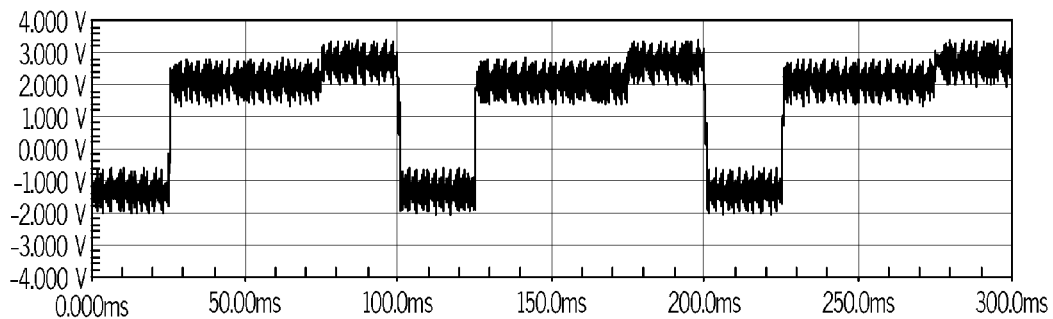
Figure 24:
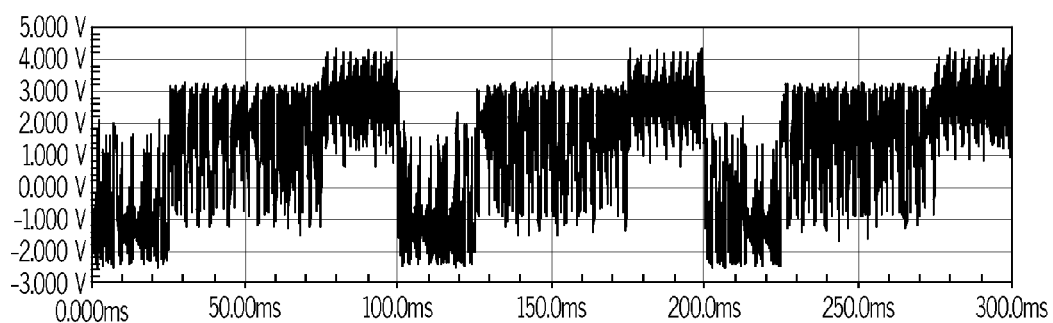
Figure 25:
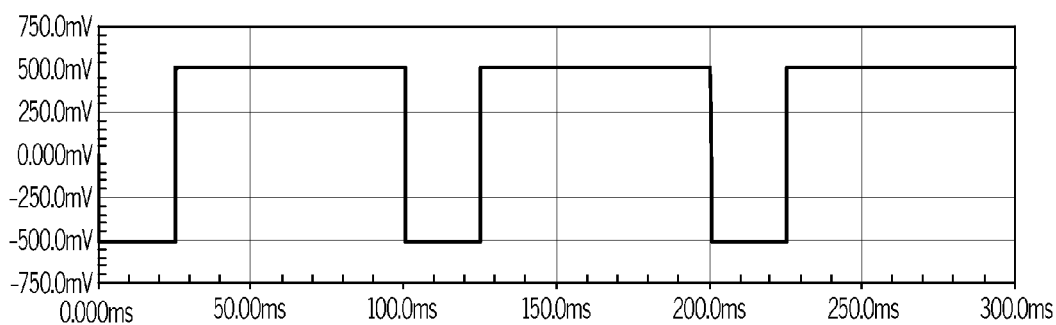

One can observe that, under optimal noise (FIG. 17), interpreting the state x>0 as logic output 0 and the state x<0 as logic output 1 yields a clean logical NOR. In a completely analogous way, by setting the thresholds at $(x^*_u, x^*_l)=(0.5V, -1.3V)$, one can realize clean NAND gates as shown in FIGS. 20-25 in almost the same optimal noise intensity regime as the previous case. Note that NAND and NOR are fundamental logic gates which can, in combination, yield all possible logical responses. In particular, FIGS. 20 and 21 show streams of inputs $I_1$ and $I_2$, which take value −0.5V when logic input is 0 and value 0.5V when logic input is 1. FIGS. 22-24 show the waveforms of $V_3=-x(t)$ obtained from the circuit of FIG. 13 (with $(x^*_u, x^*_l)=(0.5V, -1.3V)$) under noise levels D: (i) 0.5V, (ii) 1.5V, (iii) 3V. When the noise levels is in an optimal band, D=1.5V, the desired NAND logic output, while for small or larger noise, one does not obtain the necessary response. FIG. 25 shows the recovered NAND logic response from the signal $V_3=-x(t)$ through the comparator output $V_0$.

Morphing Logic Gates

One can exploit the observations discussed above to design morphing logic gates. In recent years, the wide-ranging temporal patterns of a nonlinear system have been harnessed to do computational tasks, the so-called "chaos computing" paradigm (See, for example, S. Sinha and W. L. Ditto, *Phys. Rev. Letts.* 81, 2156 (1998); K. Murali et al., *Int. J. Bifurc. Chaos (Letts.)* 13, 2669 (2003); K. E. Chlouverakis and M. J. Adams, *Electronics Letts.* 41, 359 (2005); and Taubes, G., *Science* 277, 1935 (1997); T. Munakata et al., *IEEE Trans, Circ. Syst.* 49, 1629 (2002); K. Murali and S. Sinha, *Phys. Rev. E* 75, R025201 (2007), which are hereby incorporated by reference in their entireties.

In addition to implementing a logic gate in the optimal window of noise, the system can also switch the logic response by changing the nonlinear characteristics determining well depth and position. So by adjusting value of the noise-floor, one can obtain different logic gates; making this adjustment can, effectively, manipulate the (nonlinear) transfer characteristic of the system, to optimize the logic response for a given noise-floor. This procedure is tantamount to using the nonlinearity as a "knob" to tune the system to select different logic truth tables.

Figure 26:
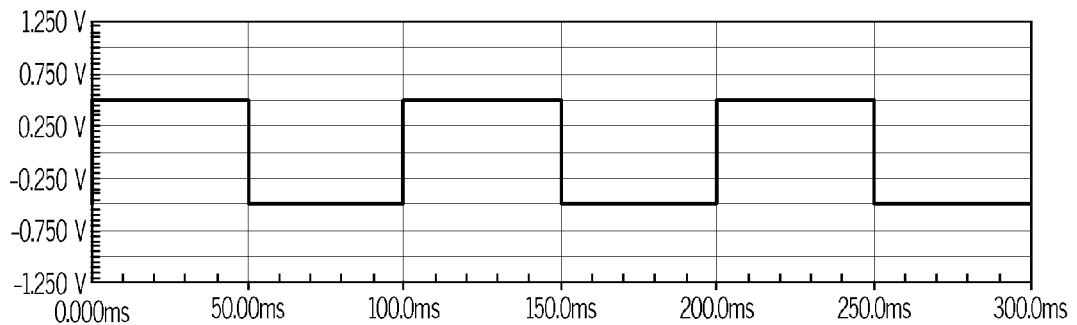
FIGS. 26-32 are graphs showing that by switching a threshold, under adequate noise, one can switch between logic responses according to one embodiment of the present invention.
Figure 27:
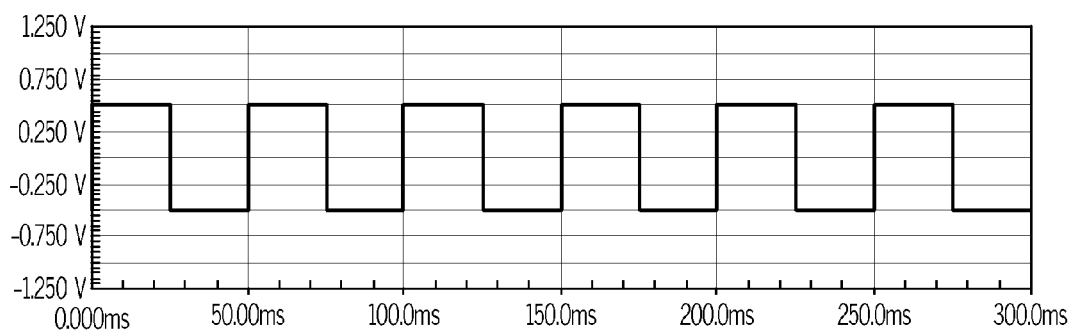
Figure 28:
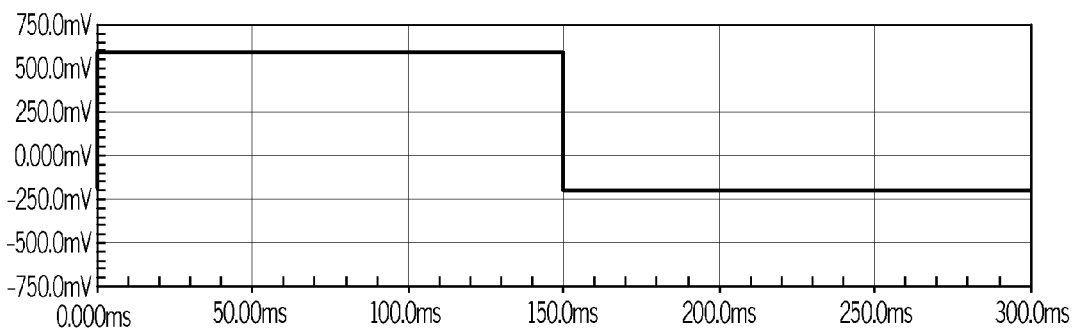
Figure 29:
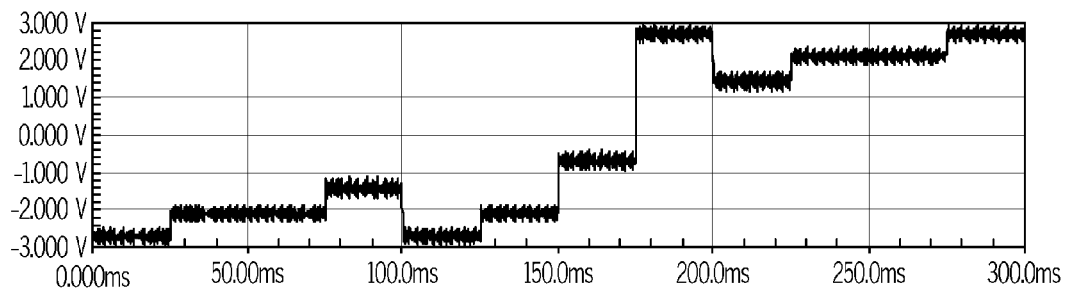
Figure 30:
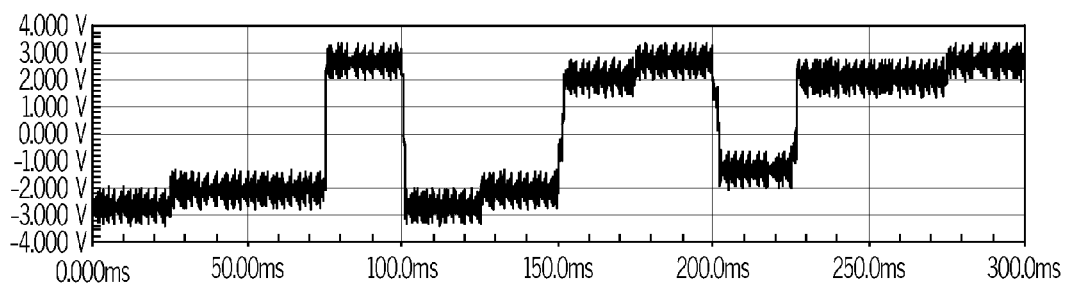
Figure 31:
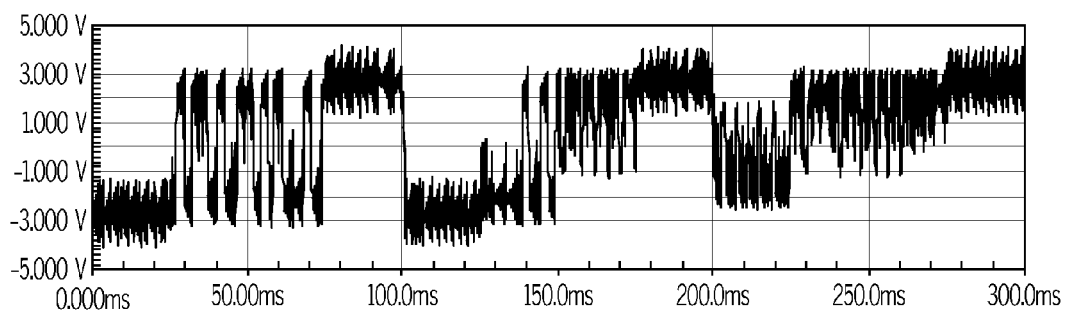
Figure 32:
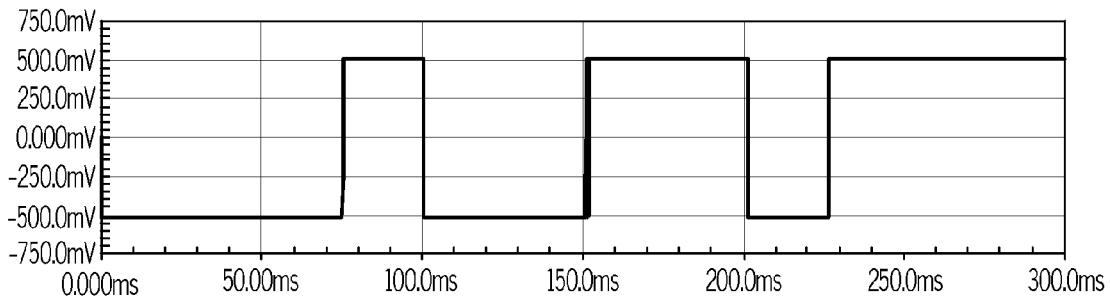

In an explicit example, by controlling the thresholds defining nonlinearity g(x) in EQ. (2), as logic controllers, it has been shown the morphing logic gates from NOR response to NAND response. Changing a threshold, as in evident from FIGS. 2 and 3, changes the position and depth of the wells in the effective potential. By switching a threshold, under adequate noise, one can switch between logic responses as well. This is demonstrated in FIGS. 26-32, with representative values of the upper threshold $x^*_u=1.3V$ giving the NOR and $x^*_u=0.5V$ giving the NAND response for fixed lower threshold $x^*_l=-1.3V$. In particular, FIGS. 26-27 show streams of inputs $I_1$ and $I_2$, which take value −0.5V when logic input is 0 and value 0.5V when logic input is 1. FIG. 28 shows the reconfigurable signal fixes the upper threshold value $x^*_u$ (between 0.5V to 1.3V) for fixed $x^*_l=-1.3V$. FIGS. 29-31 show the waveforms of $V_3=-x(t)$ obtained from the circuit of FIG. 13 under noise levels D: (i) 0.5V, (ii) 1.5V, (iii) 3V. When the noise levels is in an optimal band, D=1.5V, the desired NOR logic output is obtained for [0:150] ms when $x^*_u=1.3V$, and NAND response for [150:300] ms when $x^*_u=0.5V$. FIG. 32 shows the recovered NOR/NAND logic response from the signal $V_3=-x(t)$ through the comparator output $V_0$.

Example of a Process for Dynamically Configuring a Logic Gate

Figure 33:
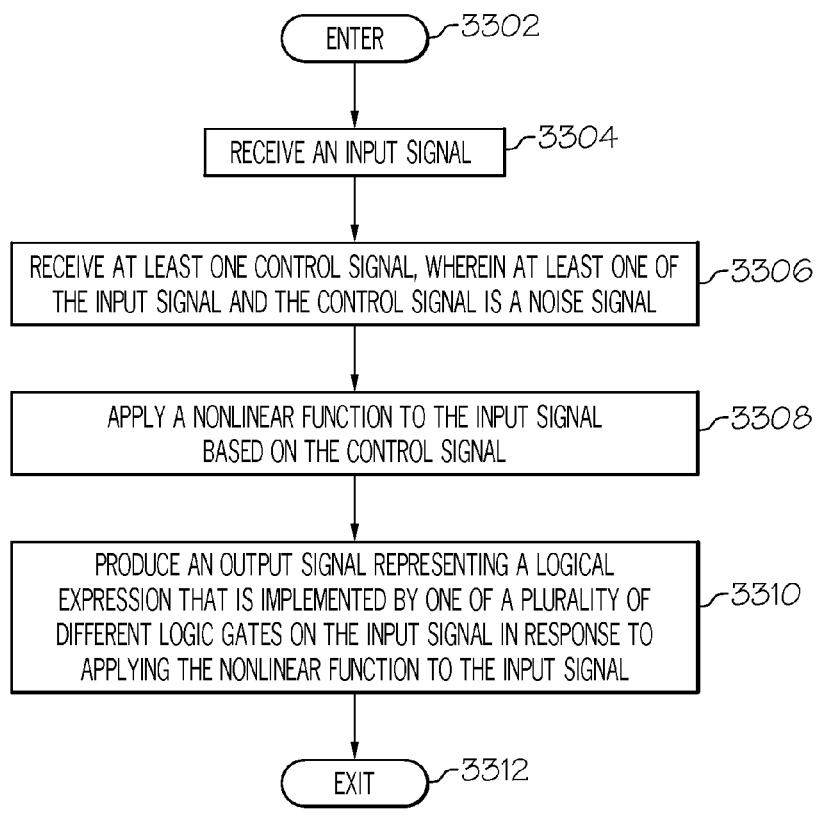
FIG. 33 is an operational flow diagram illustrating one process for reconfiguring logic circuit elements by exploiting nonlinearity and noise according to one embodiment of the present invention.

FIG. 33 is an operational flow diagram illustrating one process for dynamically configuring a logic gate based on noise and nonlinearity of the system. In one embodiment, the process discussed below with respect to FIG. 33 is performed by the circuit discussed above with respect to FIG. 13. The operational flow diagram of FIG. 33 begins at step 3302 and flows directly to step 3304. The system 100, at step 3304, receives an input signal. The system 100, at step 3306, receives at least one control input signal. At least one of the input signal and the control signal is a noise signal. The system 100, at step 3308, applies a nonlinear function to the input signal based on the control signal. The system 100, at step 3310, produces an output signal representing a logical expression that is implemented by one of a plurality of different logic gates on the input signal in response to the nonlinear function being applied to the input signal. The control flow then exits at step 3312.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A logic gate adapted to implement logical expressions, the logic gate comprising:
    at least one input adapted to receive an input signal and at least one control signal, wherein at least one of the input signal and the control signal is a noise signal;
    at least one output adapted to produce an output signal; and
    a nonlinear updater that operates as a dynamically configurable element to produce a plurality of different logic gates as selected by the control signal based at least in part on the noise signal, the nonlinear updater electrically coupled to the input and electrically coupled to the output and configured to apply a nonlinear function to the input signal in response to the control signal to produce the output signal representing a logical expression being implemented by one of the plurality of different logic gates on the input signal.

2. The logic gate of claim 1, wherein the input signal is a low amplitude signal formed from a sum of at least two trains of a first aperiodic pulse and a second aperiodic pulse.

3. The logic gate of claim 2, wherein the first aperiodic pulse encodes a first logical input of the input signal and the second aperiodic pulse encodes a second logical input of the input signal.

4. The logic gate of claim 1, wherein the nonlinear updater includes at least one threshold and the output signal representing the logical expression is produced by adjusting the threshold in a given window of noise, wherein the threshold is associated with the nonlinear function applied by the nonlinear updater.

5. The logic gate of claim 1, wherein the nonlinear updater includes an input bias and the output signal representing the logical expression is produced by adjusting the input bias for a given noise intensity.

6. The logic gate of claim 1, wherein the input signal and the control signal are two separate signals.

7. The logic gate of claim 1, wherein the at least one control signal is adjusted such that the dynamically configurable logic gate operates as an AND logic gate.

8. The logic gate of claim 1, wherein the at least one control signal is adjusted such that the dynamically configurable logic gate operates as a NAND logic gate.

9. The logic gate of claim 1, wherein the at least one control signal is adjusted such that the dynamically logic gate operates as an OR logic gate.

10. The logic gate of claim 1, wherein the at least one control signal is adjusted such that the dynamically configurable logic gate operates as a NOR logic gate.

11. A system adapted to implement a logical expression comprising:
   an array with at least two or more configurable logic gates, wherein each of the two or more configurable logic gates comprises:
      at least one input adapted to receive an input signal and at least one control signal,
      wherein at least one of the input signal and the control signal is a noise signal;
         at least one output adapted to produce an output signal; and
         a nonlinear updater that operates as a dynamically configurable element to produce a plurality of different logic gates as selected by the control signal based at least in part on the noise signal, the nonlinear updater electrically coupled to the input and electrically coupled to the output and configured to apply a nonlinear function to the input signal in response to the control signal to produce the output signal representing a logical expression being implemented by one of the plurality of different logic gates on the input signal.

12. The system of claim 11, wherein the input signal is a low amplitude signal formed from a sum of at least two trains of a first aperiodic pulse and a second aperiodic pulse.

13. The system of claim 11, wherein the nonlinear updater includes at least one threshold and the output signal representing the logical expression is produced by adjusting the threshold in a given window of noise, wherein the threshold is associated with the nonlinear function applied by the nonlinear updater.

14. The system of claim 11, wherein the nonlinear updater includes an input bias and the output signal representing the logical expression is produced by adjusting the input bias for a given noise intensity.

15. The system of claim 11, wherein the at least one control signal is adjusted such that the dynamically configurable logic gate operates as one of an AND logic gate; a NAND logic gate; an OR logic gate; and a NOR logic gate.

16. A method of changing functionality of a logic gate, the method comprising:
   receiving at least one input adapted to receive an input signal and at least one control signal, wherein at least one of the input signal and the control signal is a noise signal;
   operating a nonlinear updater as a dynamically configurable element to produce a plurality of different logic gates as selected by the control signal based at least in part on the noise signal, the nonlinear updater being electrically coupled to the input and electrically coupled to an output;
   applying, by the nonlinear updater in response to operating the nonlinear updater, a nonlinear function to the input signal in response to the control signal; and
   producing, in response to applying the nonlinear function, an output signal representing a logical expression being implemented by one of the plurality of different logic gates on the input signal.

17. The method of claim 16, wherein the input signal is a low amplitude signal formed from a sum of at least two trains of a first aperiodic pulse and a second aperiodic pulse.

18. The method of claim 16, wherein the nonlinear updater includes at least one threshold, and wherein and the producing further comprises:
   adjusting the threshold in a given window of noise, wherein the threshold is associated with the nonlinear function applied by the nonlinear updater.

19. The method of claim 16, wherein the nonlinear updater includes an input bias, and wherein the producing further comprises:
   adjusting the input bias for a given noise intensity.

20. The method of claim 16, further comprising:
   adjusting the at least one control signal such that the dynamically configurable logic gate operates as one of an AND logic gate; a NAND logic gate; an OR logic gate; and a NOR logic gate.

* * * * *

UNITED STATES PATENT AND TRADEMARK OFFICE
CERTIFICATE OF CORRECTION

| | |
|---|---|
| PATENT NO. | : 7,924,059 B2 |
| APPLICATION NO. | : 12/394749 |
| DATED | : April 12, 2011 |
| INVENTOR(S) | : William L. Ditto et al. |

It is certified that error appears in the above-identified patent and that said Letters Patent is hereby corrected as shown below:

Column 1, line 52, please replace "encountering" with "encountered"

Column 3, line 1, please delete "as are"

Column 12, line 36, please delete "and" after "wherein"

Signed and Sealed this
Twenty-fourth Day of May, 2011

David J. Kappos
*Director of the United States Patent and Trademark Office*